(12) United States Patent
Arai et al.

(10) Patent No.: US 12,506,106 B2
(45) Date of Patent: Dec. 23, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masatoshi Arai, Hakusan Ishikawa (JP); Kazuki Matsuo, Nonoichi Ishikawa (JP); Masaru Izumisawa, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 484 days.

(21) Appl. No.: 18/178,973

(22) Filed: Mar. 6, 2023

(65) Prior Publication Data

US 2024/0088086 A1   Mar. 14, 2024

(30) Foreign Application Priority Data

Sep. 14, 2022   (JP) .................................. 2022-146064

(51) Int. Cl.
*H01L 23/00* (2006.01)
*H01L 23/495* (2006.01)
(52) U.S. Cl.
CPC ........ *H01L 24/32* (2013.01); *H01L 23/49513* (2013.01); *H01L 23/49524* (2013.01);
(Continued)
(58) Field of Classification Search
CPC ............... H01L 23/49524; H01L 24/32; H01L 23/49562; H01L 23/49503; H01L 24/33;
(Continued)

(56) References Cited

U.S. PATENT DOCUMENTS 9,006,873 B2 * 4/2015 Nikitin .................... H01L 24/80
257/676
2012/0193671 A1 * 8/2012 Chien ................ H10H 20/8582
257/E33.059
(Continued)

FOREIGN PATENT DOCUMENTS

JP   2009-087964 A   4/2009
JP   2012-099559 A   5/2012
(Continued)

*Primary Examiner* — Mouloucoulaye Inoussa
(74) *Attorney, Agent, or Firm* — Kim & Stewart LLP

(57) ABSTRACT

A semiconductor device includes a base member, a semiconductor chip, and a conductive member. The base member includes a first surface, a second surface opposite to the first surface, and a protrusion at the second surface side. The semiconductor chip is mounted on the second surface of the base member. The semiconductor chip includes first and second electrodes, a control pad, and a semiconductor part. The semiconductor part has front and back surfaces; the first electrode is provided on the back surface; and the second electrode and the control pad are provided on the front surface. The conductive member bonded on the second electrode via a connection member. The connection member includes a side surface extending along a space between the second electrode and the control pad. The protrusion of the base member overlaps the second connection member and extends along the side surface of the connection member.

14 Claims, 6 Drawing Sheets

(52) U.S. Cl.
CPC .. *H01L 23/49562* (2013.01); *H01L 23/49568* (2013.01); *H01L 2224/26175* (2013.01); *H01L 2224/32058* (2013.01); *H01L 2224/32059* (2013.01); *H01L 2224/32245* (2013.01); *H01L 2924/3512* (2013.01)

(58) Field of Classification Search
CPC ......... H01L 23/49513; H01L 23/49568; H01L 25/18; H01L 24/83; H01L 23/051; H01L 25/50; H01L 24/84; H01L 25/072; H01L 21/4871; H01L 23/48; H01L 24/73; H01L 23/562; H01L 23/3735; H01L 24/40; H01L 2924/3512; H01L 2224/32245; H01L 2224/32058; H01L 2224/32059; H01L 2224/26175; H01L 2224/37124; H01L 2224/84444; H01L 2924/00014; H01L 2224/84439; H01L 2224/83439; H01L 2224/83444; H01L 2224/05644; H01L 2224/05639; H01L 2224/40499; H01L 2924/01047; H01L 2224/37147; H01L 2224/29339; H01L 2224/05124; H01L 2924/01204

See application file for complete search history.

(56) References Cited

U.S. PATENT DOCUMENTS

| | | | |
|---|---|---|---|
| 2014/0021634 A1* | 1/2014 | Nikitin | H01L 23/49827 257/774 |
| 2016/0300988 A1* | 10/2016 | Oh | H01L 24/29 |
| 2017/0352791 A1* | 12/2017 | Kang | G02B 19/0071 |
| 2021/0280534 A1* | 9/2021 | Hokazono | H01L 25/18 |
| 2023/0052304 A1* | 2/2023 | Shi | H10H 20/01 |

FOREIGN PATENT DOCUMENTS

| | | |
|---|---|---|
| JP | 2014-197634 A | 10/2014 |
| JP | 2019-110317 A | 7/2019 |
| JP | 2019-153749 A | 9/2019 |
| JP | 2021-002637 A | 1/2021 |

* cited by examiner

SEMICONDUCTOR DEVICE

CROSS-REFERENCE TO RELATED APPLICATIONS

This application is based upon and claims the benefit of priority from Japanese Patent Application No. 2022-146064, filed on Sep. 14, 2022; the entire contents of which are incorporated herein by reference.

FIELD

Embodiments relate to a semiconductor device.

BACKGROUND

A semiconductor device is required to have a wide safe operating area (SOA).

DETAILED DESCRIPTION

Figure 1A:
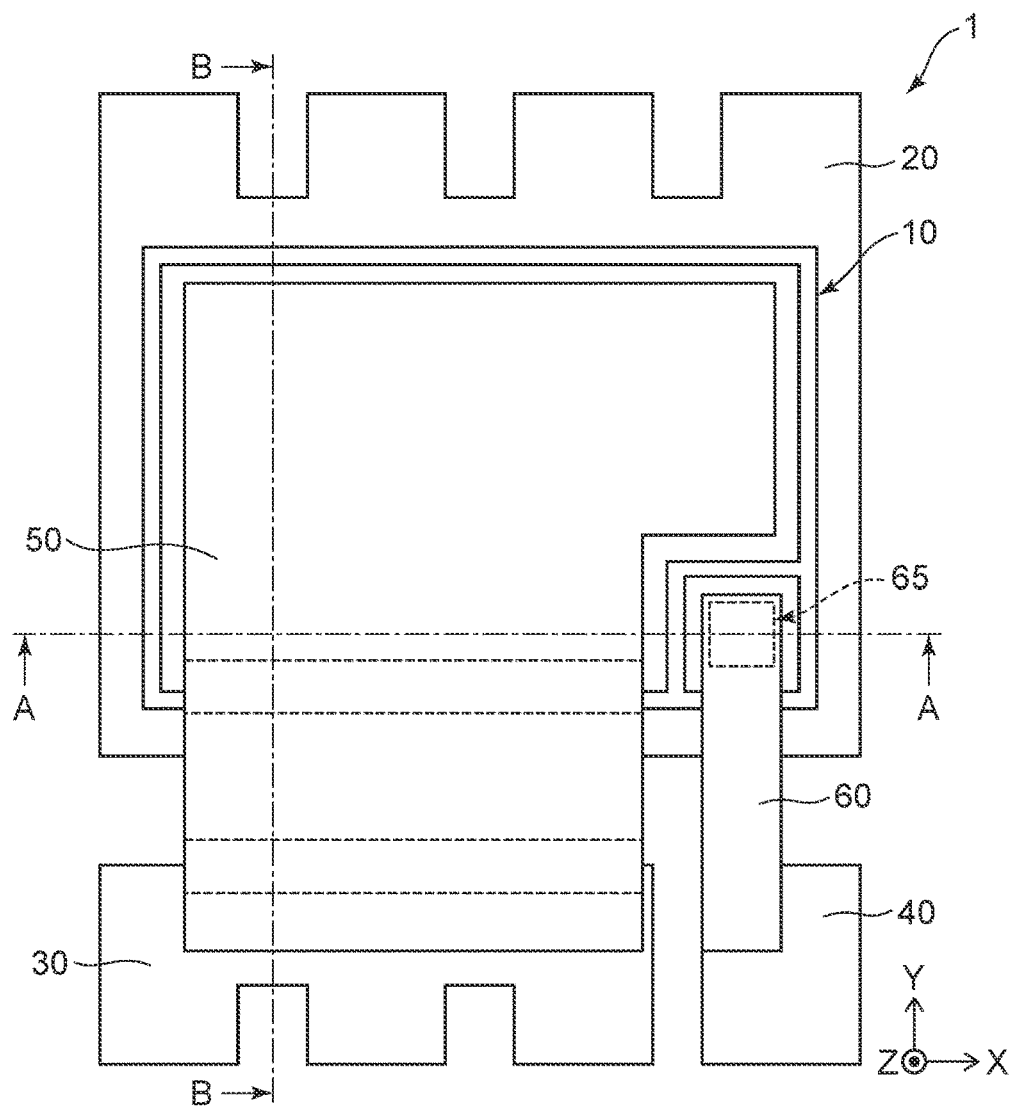
FIGS. 1A and 1B are schematic views showing a semiconductor device according to an embodiment.

According to one embodiment, a semiconductor device includes a base member, a semiconductor chip, and a first conductive member. The base member includes a first surface, a second surface at a side opposite to the first surface, and a protrusion provided at the second surface side. The protrusion protrudes in a first direction perpendicular to the second surface. The semiconductor chip is mounted on the second surface of the base member via a first connection member. The semiconductor chip includes a first electrode, a second electrode, a control pad, and a semiconductor part. The semiconductor part has a front surface and a back surface; the first electrode is provided on the back surface; and the second electrode and the control pad are provided on the front surface. The control pad is apart from the second electrode, and the semiconductor part is positioned between the first electrode and the second electrode and between the first electrode and the control pad. The first connection member is connected to the first electrode. The first conductive member bonded on the second electrode of the semiconductor chip via a second connection member. The second connection member includes a side surface extending along a space between the second electrode and the control pad of the semiconductor chip. The protrusion of the base member overlaps the second connection member in the first direction, and extends along the side surface below the side surface of the second connection member.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
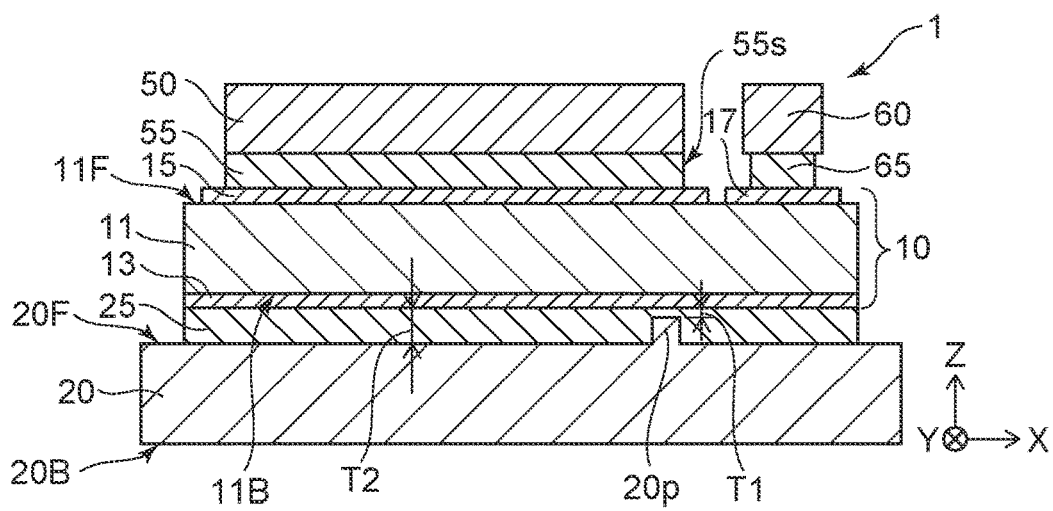

FIGS. 1A and 1B are schematic views showing a semiconductor device 1 according to an embodiment. FIG. 1A is a plan view showing the upper surface of the semiconductor device 1. FIG. 1B is a cross-sectional view along line A-A shown in FIG. 1A.

The semiconductor device 1 is, for example, a MOS transistor for power control. The semiconductor device 1 includes, for example, a semiconductor chip 10, a base member 20, a first terminal 30, a second terminal 40, a first conductive member 50, and a second conductive member 60.

As shown in FIG. 1A, the semiconductor chip 10 is mounted on the base member 20. The first terminal 30 and the second terminal 40 are apart from the base member 20, for example, in the X-Y plane. The first terminal 30 and the second terminal 40 are apart from each other.

The first terminal 30 is electrically connected to the semiconductor chip 10 via the first conductive member 50. The first conductive member 50 is, for example, a plate-shaped metal connector. The second terminal 40 is electrically connected to the semiconductor chip 10 via the second conductive member 60. The second conductive member 60 is, for example, a plate-shaped metal connector. Alternatively, the second conductive member 60 may be, for example, a metal wire.

As shown in FIG. 1B, the semiconductor chip 10 includes a semiconductor part 11, a first electrode 13, a second electrode 15, and a control pad 17. The semiconductor part 11 is, for example, silicon carbide (SiC). The semiconductor part 11 is positioned between the first electrode 13 and the second electrode 15 and between the first electrode 13 and the control pad 17. The first electrode 13 is provided on a back surface 11B of the semiconductor part 11. The second electrode 15 and the control pad 17 are provided on a front surface 11F of the semiconductor part 11 and are apart from each other. The control pad 17 is provided on the semiconductor part 11 with an insulating film (not illustrated) interposed, and is electrically insulated from the semiconductor part 11.

The first electrode 13 is, for example, the drain electrode of the MOS transistor. The second electrode 15 is, for example, the source electrode of the MOS transistor. The control pad 17 is electrically connected to, for example, the gate electrode (not illustrated) of the MOS transistor. The gate electrode is provided, for example, between the semiconductor part 11 and the second electrode 15.

The base member 20 includes a back surface 20B (a first surface), and a front surface 20F (a second surface) at the side opposite to the back surface 20B. The semiconductor chip 10 is mounted on the front surface 20F of the base member 20 via a first connection member 25. The first connection member 25 is, for example, a solder material. The first electrode 13 of the semiconductor chip 10 is connected to the first connection member 25. The semiconductor chip 10 is electrically connected to the base member 20 via the first connection member 25.

The first conductive member 50 is connected to the second electrode 15 via a second connection member 55. The second connection member 55 is, for example, a solder material. The first conductive member 50 is electrically connected to the second electrode 15 via the second connection member 55.

The second conductive member 60 is connected to the control pad 17 via a third connection member 65. The third connection member 65 is, for example, a solder material. The second conductive member 60 is electrically connected to the control pad 17 via the third connection member 65. When a metal wire is used as the second conductive member 60, the second conductive member 60 is directly bonded on the control pad 17.

As shown in FIG. 1B, the base member 20 includes a protrusion 20p that is partially provided on the front surface 20F side. The semiconductor chip 10 is mounted so that the second connection member 55 overlaps the protrusion 20p in, for example, the Z-direction perpendicular to the front surface 20F of the base member 20. The protrusion 20p is positioned below a side surface 55s of the second connection member 55 that faces the third connection member 65; and the protrusion 20p extends along the side surface 55s (see FIG. 3). The protrusion 20p has a thickness in the Z-direction of, for example, 15 to 20 μm.

In the semiconductor device 1, the first connection member 25 has a first thickness T1 in the Z-direction and a second thickness T2 in the Z-direction. The first thickness T1 is provided between the semiconductor chip 10 and the protrusion 20p of the base member 20. The second thickness T2 is provided between the semiconductor chip 10 and the base member 20 other than the protrusion 20p; and the thickness T1 is less than the thickness T2. The second thickness T2 is, for example, 22 μm. Thereby, it is possible to prevent voids generated between the semiconductor chip 10 and the protrusion 20p while mounting the semiconductor chip 10 on the base member 20 even when voids occur in the first connection member 25. For example, in the reflow process of mounting the semiconductor chip 10 on the base member 20, small voids occur between the semiconductor chip 10 and the first connection member 25, and may collect to form a large void. Such voids are prevented from generating between the semiconductor chip 10 and the protrusion 20p. Also, the protrusion 20p prevents such voids from moving inside the first connection member 25.

Figure 7A:
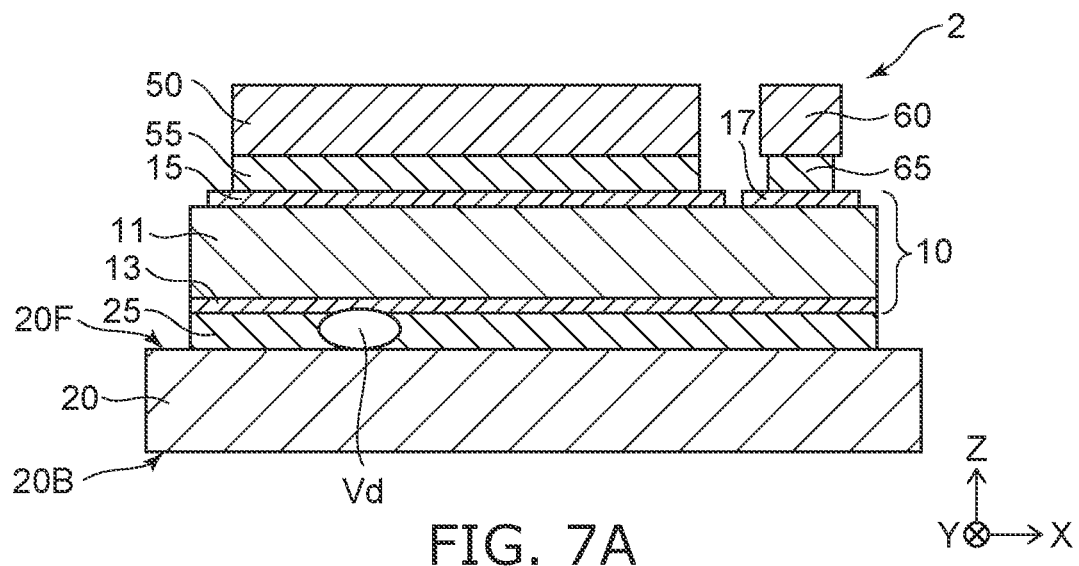
FIGS. 7A and 7B are schematic cross-sectional views showing a semiconductor device according to a comparative example.
Figure 7B:
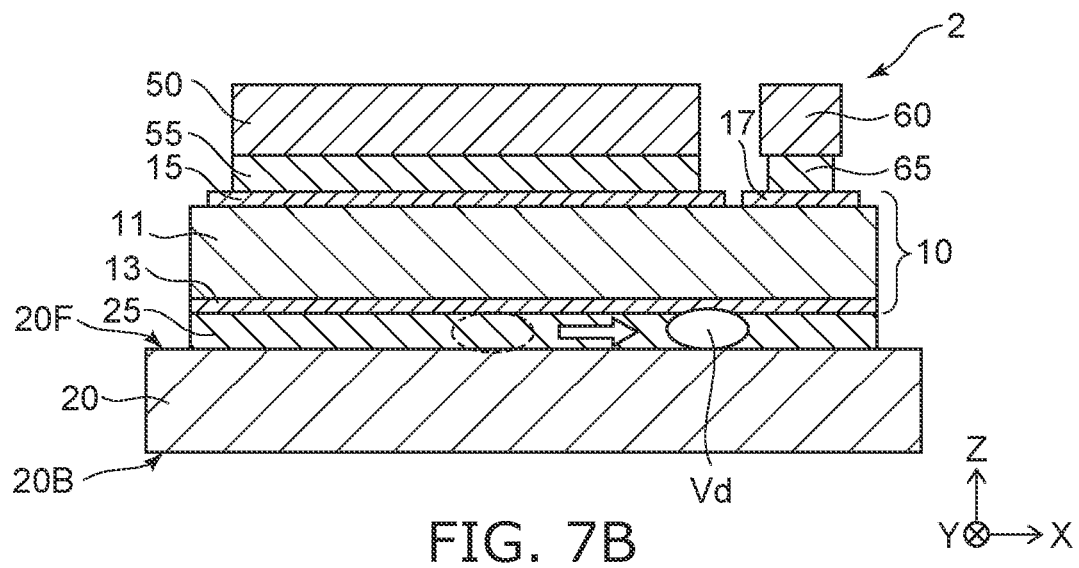

On the other hand, in a semiconductor device 2 according to a comparative example shown in FIGS. 7A and 7B, the protrusion 20p is not provided at the front surface 20F side of the base member 20. The semiconductor chip 10 is mounted on a flat front surface 20F via the first connection member 25.

There may be a case where a void Vd occurs in the first connection member 25, for example, when the semiconductor chip 10 has a large size in an X-direction and a Y-direction. Such a void Vd partially inhibits the thermal conduction from the semiconductor chip 10 to the base member 20.

As shown in FIG. 7A, when the void Vd occurs between the base member 20 and the first conductive member 50, the thermal conduction path from the semiconductor chip 10 to the first conductive member 50 via the second connection member 55 is maintained, whereas the thermal conduction from the semiconductor chip 10 to the base member 20 is partially inhibited. Therefore, a temperature rise is suppressed inside the semiconductor chip 10.

As shown in FIG. 7B, when the void Vd is positioned below the space between the first conductive member 50 and the second conductive member 60, the thermal conduction from the semiconductor chip 10 to the base member 20 is inhibited, and an upward thermal conduction path is lost. That is, the semiconductor chip 10 includes a region at which the heat dissipation is limited, and the temperature distribution in the semiconductor chip 10 becomes nonuniform. In other words, when the void Vd is positioned below the space between the first conductive member 50 and the second conductive member 60, the semiconductor chip 10 includes a region at which the temperature rises and the electrical resistance locally decreases. Therefore, current easily concentrates at the vicinity of the void Vd; and the temperature rises more. As a result, there may be a case where the current is acceleratingly concentrated, causing the breakdown of the semiconductor chip 10. In other words, in the semiconductor device 2, there is a risk that the safe operating area (SOA) may become narrow.

Such a void Vd often occurs in the first connection member 25 below the center of the semiconductor chip 10 and then moves toward the edge of the semiconductor chip 10. In contrast, according to the embodiment, the semiconductor device 1 includes the protrusion 20p of the base member 20 that is provided below the side surface of the second connection member 55 facing the third connection member 65. The protrusion 20p extends along the side surface of the second connection member 55 facing the third connection member 65. Thereby, it is possible to prevent the void Vd below the center of the semiconductor chip 10 from moving toward a region below the space between the first conductive member 50 and the second conductive member 60. Accordingly, it is possible in the semiconductor device 1 to maintain the wide SOA.

Figure 2:
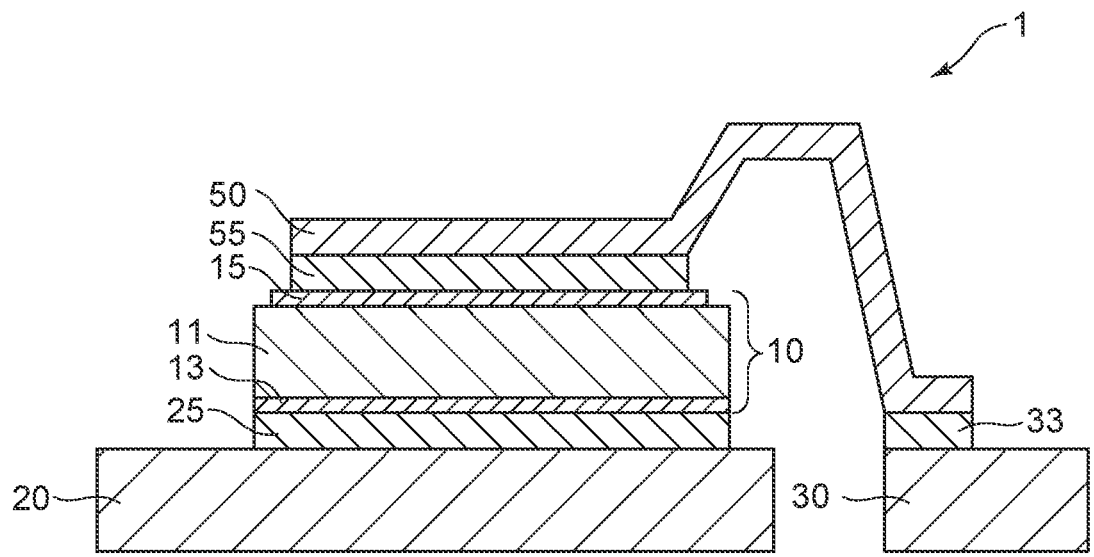
FIG. 2 is a schematic cross-sectional view showing the semiconductor device according to the embodiment.

FIG. 2 is a schematic cross-sectional view showing the semiconductor device 1 according to the embodiment. FIG. 2 is a schematic view showing a cross section along line B-B shown in FIG. 1A.

As shown in FIG. 2, the first conductive member 50 is, for example, a bent plate-shaped connector. By providing the first conductive member 50, large current flows between the first terminal 30 and the second electrode 15 of the semiconductor chip 10; and the heat of the semiconductor chip 10 can be dissipated via the second connection member 55 and the first conductive member 50.

The first conductive member 50 is connected to the second electrode 15 of the semiconductor chip 10 via the second connection member 55. Also, the first conductive member 50 is connected to the first terminal 30 via a fourth connection member 33. The fourth connection member 33 is, for example, a solder material. The first conductive member 50 is connected preferably to the entire surface of the second electrode 15 of the semiconductor chip 10 other than the outer periphery of the second electrode 15 (see FIG. 1A). Thereby, the semiconductor chip 10 can be operated with a large current, and the heat that is generated in the semiconductor part 11 can be efficiently dissipated.

Figure 3:
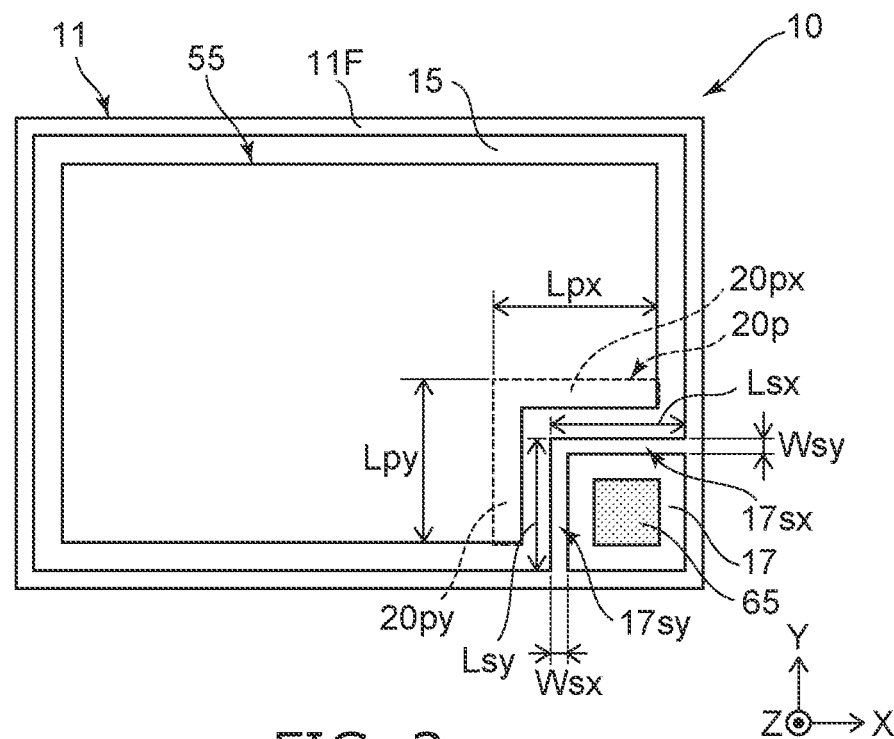
FIG. 3 is a schematic plan view showing the semiconductor chip according to the embodiment.

FIG. 3 is a schematic plan view showing the semiconductor chip 10 according to the embodiment. FIG. 3 is a plan view showing the front surface 11F side of the semiconductor part 11. FIG. 3 shows the layout of the second electrode 15, the control pad 17, the second connection member 55, and the third connection member 65.

As shown in FIG. 3, the second electrode 15 and the control pad 17 are provided on the front surface 11F of the semiconductor part 11. The front surface 11F of the semiconductor part 11 is, for example, quadrilateral; and the control pad is located at one corner of the quadrilateral. The second electrode 15 covers the greater part of the front surface 11F side of the semiconductor part 11 except for the outer periphery of the semiconductor part 11 and the corner of the semiconductor part 11 at which the control pad 17 is provided. The second connection member 55 preferably covers the second electrode 15 other than the outer edge of the second electrode 15.

The control pad 17 is apart from the second electrode 15. The space between the second electrode 15 and the control pad 17 includes, for example, a first space 17sx and a second space 17sy. The first space 17sx extends in the X-direction and has a long-side length Lsx in the X-direction and a short-side width Wsy in the Y-direction. The second space 17sy extends in the Y-direction and has a long-side length Lsy in the Y-direction and a short-side width Wsx in the X-direction.

As shown by the broken line in FIG. 3, the protrusion 20p of the base member 20 has, for example, a length Lpx in the X-direction and a length Lpy in the Y-direction. The protrusion 20p is formed so that the length Lpx in the X-direction is equal to or greater than the long-side length Lsx in the X-direction of the first space 17sx between the second electrode 15 and the control pad 17. Also, the protrusion 20p is preferably formed so that the length Lpy in the Y-direction is equal to or greater than the long-side length Lsy in the Y-direction of the second space 17sy between the second electrode 15 and the control pad 17.

The protrusion 20p has, for example, an L-shaped planar shape. In other words, the protrusion 20p includes, for example, a first portion 20px extending in the X-direction, and a second portion 20py extending in the Y-direction; and the end of the first portion 20px is linked to the end of the second portion 20py.

In the example, the protrusion 20p is positioned under the second connection member 55, but the embodiment is not limited thereto. The protrusion 20p may be widened, for example, in the direction from the second connection member 55 toward the third connection member 65 so that the protrusion 20p overlaps the space between the second connection member 55 and the third connection member 65.

Figure 4A:
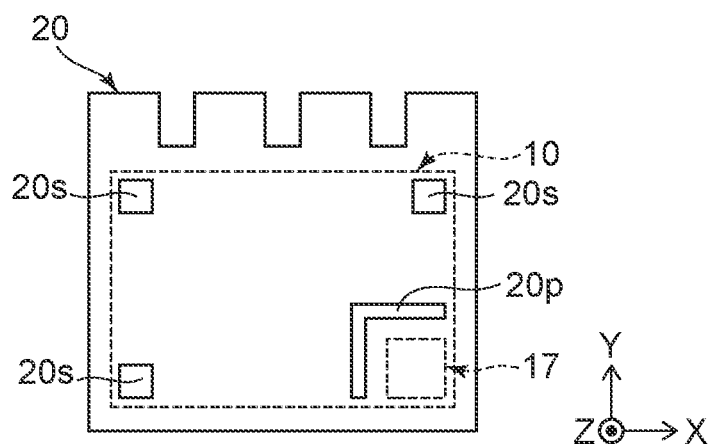
FIGS. 4A to 4C are schematic plan views illustrating the base member according to the embodiment.
Figure 4B:
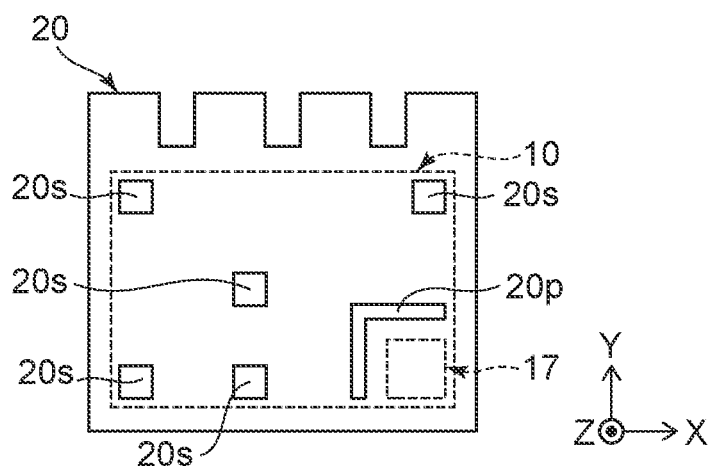
Figure 4C:
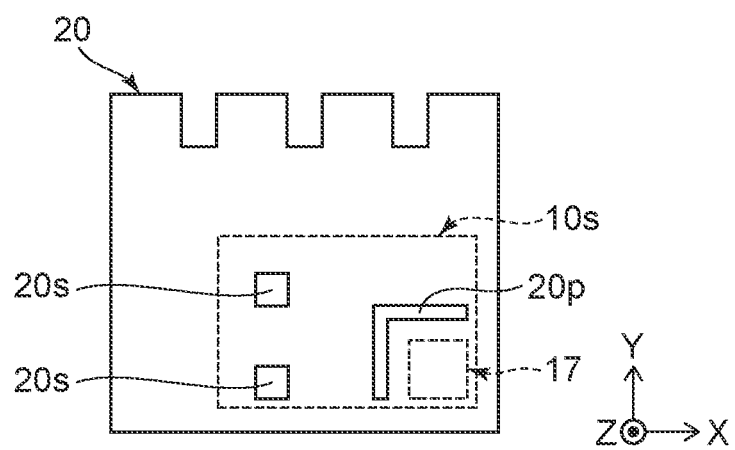

FIGS. 4A to 4C are schematic plan views illustrating the base member 20 according to the embodiment. The broken lines shown in FIGS. 4A to 4C show the outer edge of the semiconductor chip 10 and the outer edge of the control pad 17.

As shown in FIG. 4A, in a plan view, the protrusion 20p of the base member 20 is positioned between the control pad 17 and the center of the semiconductor chip 10. In other words, the protrusion 20p is positioned to block the path of the void Vd that occurs under the center of the semiconductor chip 10 and moves toward the corner under the control pad 17.

The base member 20 may further include other protrusions 20s. The protrusions 20s each have a smaller size in the X-direction and the Y-direction than that of the protrusion 20p. The protrusions 20s are positioned, for example, below three corners of the semiconductor chip 10. Thereby, the semiconductor chip 10 can be mounted to the front surface 20F of the base member 20 without tilting (see FIG. 1B).

When the semiconductor chip 10 is mounted on the base member 20 and tilted with respect to the front surface 20F, it is difficult to connect the first conductive member 50 on the semiconductor chip 10. Moreover, the escape route of air remaining between the semiconductor chip 10 and the first connection member 25 is constrained, and the void Vd easily occurs in the first connection member 25. Such discrepancies can be avoided by providing the protrusions 20s. The multiple protrusions 20s increase the surface area facing the semiconductor chip 10 via the first connection member 25. Thereby, the stress that is applied to the semiconductor chip 10 mounted on the base member 20 can be relaxed, and chip cracks and the like can be avoided.

As shown in FIG. 4B, in addition to the protrusions 20s positioned below the three corners of the semiconductor chip 10, another protrusion 20s may be provided below the center of the semiconductor chip 10; and yet another protrusion 20s and the protrusion 20p are arranged in the X-direction. Even when a semiconductor chip 10s is provided with a smaller size than the size of the semiconductor chip 10 (see FIG. 4C), the semiconductor chip 10s can be stably held thereby.

As shown in FIG. 4C, the multiple protrusions 20s may be provided so that the semiconductor chip 10s smaller than the semiconductor chip 10 is hold thereon. The protrusions 20s are arranged, for example, in the Y-direction at the center of the base member 20.

Although two protrusions 20s for holding the semiconductor chip 10s are shown in FIGS. 4B and 4C, three or more protrusions 20s may be provided. Thus, by providing the multiple protrusions 20s to overlap the semiconductor chip 10, the tilt of the semiconductor chip 10 is suppressed. The air that remains between the semiconductor chip 10 and the first connection member 25 can easily escape from the semiconductor chip 10. Thereby, it is possible to prevent the void Vd from being generated in the first connection member 25. Moreover, the stress that is applied to the semiconductor chip 10 can be reduced.

Figure 5A:
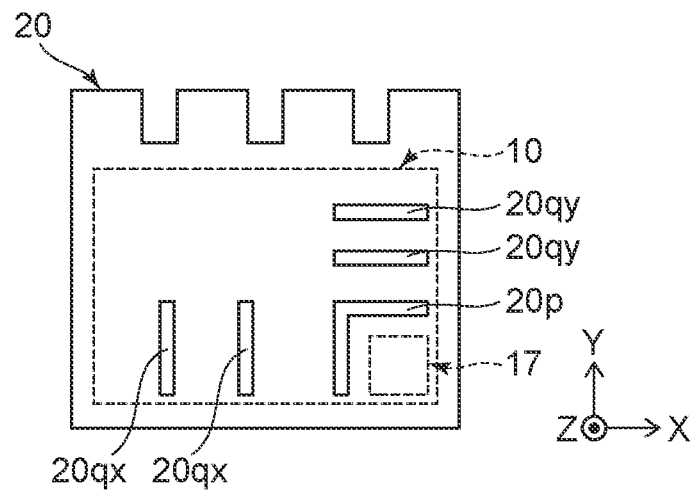
FIGS. 5A to 5C are schematic plan views illustrating the base members according to modifications of the embodiment.
Figure 5B:
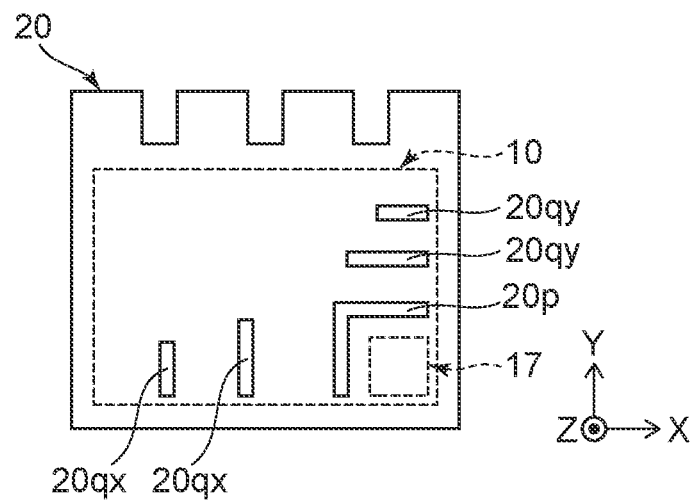
Figure 5C:
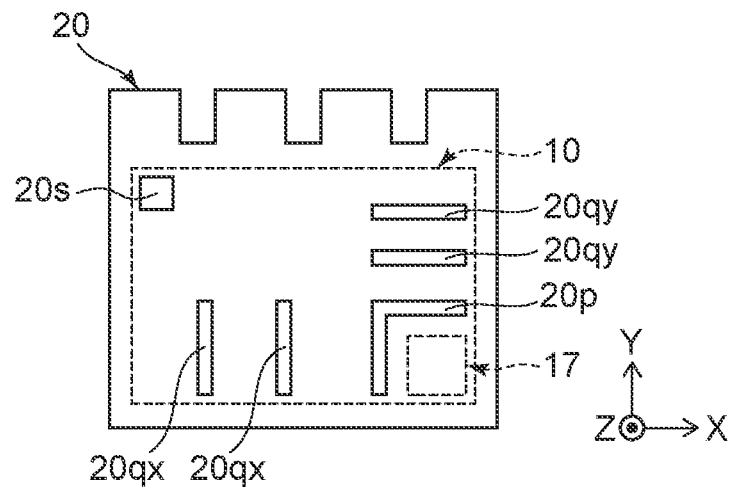

FIGS. 5A to 5C are schematic plan views illustrating the base members 20 according to modifications of the embodiment. The outer edge of the semiconductor chip 10 and the outer edge of the control pad 17 are shown by broken lines in FIGS. 5A to 5C.

As shown in FIG. 5A, the base member 20 includes the protrusion 20p, at least one protrusion 20qx, and at least one protrusion 20qy. In the plan view, the protrusion 20p and the protrusions 20qx are arranged in the X-direction. The protrusion 20p and the protrusions 20qx are arranged, for example, at uniform spacing. The protrusion 20p and the protrusions 20qy are arranged in the Y-direction. The protrusion 20p and the protrusions 20qy are arranged, for example, at uniform spacing.

The protrusion 20qx extends in the Y-direction and has, for example, a length same as the Y-direction length Lpy of the protrusion 20p (see FIG. 3). The protrusion 20qx has a X-direction width less than a Y-direction length thereof.

The protrusion 20qy extends in the X-direction and has, for example, a length same as the X-direction length Lpx of the protrusion 20p (see FIG. 3). The protrusion 20qy has a Y-direction width less than the X-direction length thereof.

The protrusion 20qx and the protrusion 20qy are arranged so that the movement of the void Vd is not hindered in directions from the center toward the outer periphery of the semiconductor chip 10 (see FIGS. 7A and 7B).

As shown in FIG. 5B, the protrusions 20qx may have shorter Y-direction lengths as a distance to the protrusion 20p in the X-direction increases. Similarly, the protrusions $20qy$ may have shorter X-direction lengths as a distance to the protrusion $20p$ in the Y-direction increases.

As shown in FIG. 5C, the base member 20 may further include the protrusion $20s$. The protrusion $20s$ has a smaller size in the X-direction and the Y-direction than the sizes of the protrusions $20p$, $20qx$, and $20qy$. The protrusion $20s$ is provided below a corner of the semiconductor chip 10 diagonal to the corner at which the control pad 17 is located.

By providing the protrusions $20qx$ and $20qy$ shown in FIGS. 5A to 5C, when mounting the semiconductor chip 10 on the base member 20, for example, the molten first connection member 25 easily moves in directions from the center toward the outer periphery of the semiconductor chip 10; and thereby, it is possible to reduce the voids Vd. Also, when mounting the semiconductor chip 10, tilting with respect to the front surface 20F of the base member 20 can be prevented.

Figure 6A:
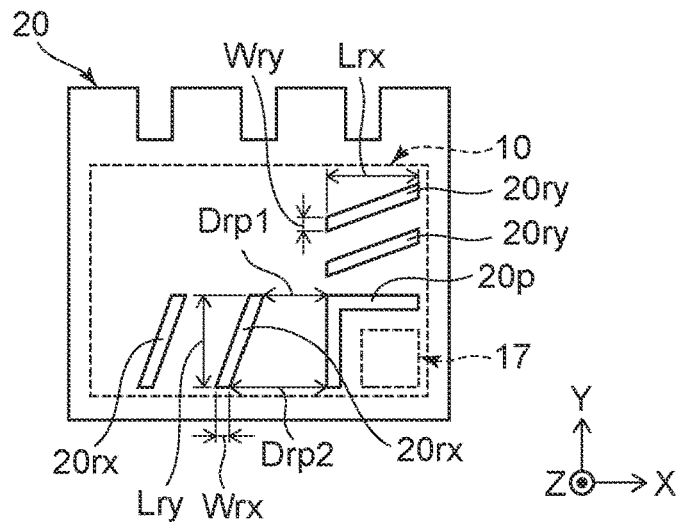
FIGS. 6A to 6C are schematic plan views illustrating the base members according to modifications of the embodiment.
Figure 6B:
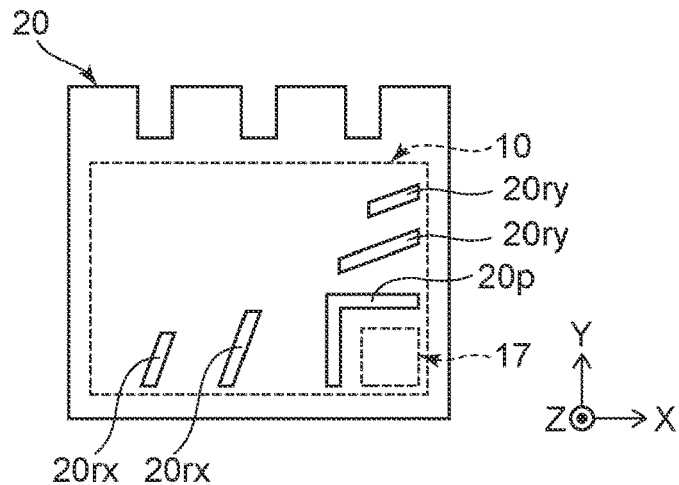
Figure 6C:
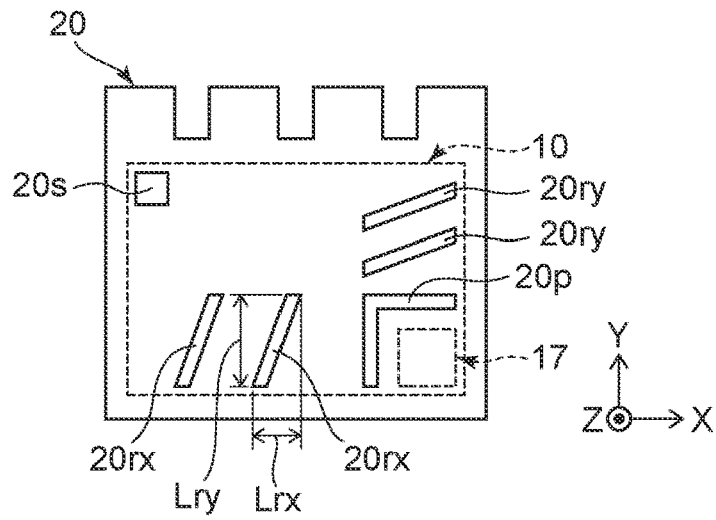

FIGS. 6A to 6C are schematic plan views illustrating the base members 20 according to modifications of the embodiment. In FIGS. 6A to 6C, the outer edge of the semiconductor chip 10 and the outer edge of the control pad 17 are shown by broken lines.

As shown in FIG. 6A, the base member 20 includes the protrusion $20p$, at least one protrusion $20rx$, and at least one protrusion $20ry$. In the plan view, the protrusion $20p$ and the protrusion $20rx$ are arranged in the X-direction. The protrusion $20p$ and the protrusions $20ry$ are arranged in the Y-direction.

The protrusion $20rx$ extends in a direction oblique to the X-direction and the Y-direction. The protrusion $20rx$ has a length Lry in the Y-direction greater than a width Wrx in the X-direction thereof. The protrusion $20p$ has a distance Drp1 to the protrusion $20p$ from one end of the protrusion $20rx$ positioned at the center vicinity of the semiconductor chip 10 and a distance Drp2 to the protrusion $20p$ from the other end of the protrusion $20rx$ positioned at the outer edge vicinity of the semiconductor chip 10. The protrusion $20rx$ is arranged on the base member 20 so that the distance Drp1 is less than the distance Drp2.

Likewise, the protrusion $20ry$ extends in a direction oblique to the X-direction and the Y-direction. The protrusion $20ry$ has a length Lrx in the X-direction greater than a width Wry in the Y-direction thereof. The distance to the protrusion $20p$ from one end of the protrusion $20ry$ positioned at the center vicinity of the semiconductor chip 10 is less than the distance to the protrusion $20p$ from the other end of the protrusion $20ry$ positioned at the outer edge vicinity of the semiconductor chip 10.

As shown in FIG. 6B, the protrusions $20rx$ may have shorter Y-direction lengths as a distance to the protrusion $20p$ in the X-direction increases. Similarly, the protrusions $20ry$ may have shorter X-direction lengths as a distance to the protrusion $20p$ in the Y-direction increases.

As shown in FIG. 6C, the base member 20 may further include the protrusion $20s$. The protrusion $20s$ has a size smaller in the X-direction and the Y-direction than that of the protrusion $20p$, and smaller than the length Lrx in the X-direction and the length Lry in the Y-direction of the protrusion $20rx$ and the protrusion $20ry$. The protrusion $20s$ is provided, for example, below the corner of the semiconductor chip 10 positioned diagonal to the corner at which the control pad 17 is located.

As shown in FIGS. 6A to 6C, by providing the protrusions $20rx$ and $20ry$, the molten first connection member 25 can move more easily in directions from the center toward the outer periphery of the semiconductor chip 10 when mounting the semiconductor chip 10 on the base member 20; and thereby, the voids Vd can be reduced. Also, when mounting the semiconductor chip 10, tilting with respect to the front surface 20F of the base member 20 can be prevented.

The semiconductor device according to the embodiments includes the following aspects;

Note 1: A semiconductor device, comprising:
a base member including a first surface, a second surface at a side opposite to the first surface, and a protrusion provided at the second surface side, the protrusion protruding in a first direction perpendicular to the second surface;
a semiconductor chip mounted on the second surface of the base member via a first connection member, the semiconductor chip including a first electrode, a second electrode, a control pad, and a semiconductor part, the semiconductor part having a front surface and a back surface, the first electrode being provided on the back surface, the second electrode and the control pad being provided on the front surface, the control pad being apart from the second electrode, the semiconductor part being positioned between the first electrode and the second electrode and between the first electrode and the control pad, the first connection member being connected to the first electrode; and
a first conductive member bonded on the second electrode of the semiconductor chip via a second connection member, the second connection member including a side surface extending along a space between the second electrode and the control pad of the semiconductor chip,
the protrusion of the base member overlapping the second connection member in the first direction, the protrusion of the base member extending along the side surface below the side surface.

Note 2: The device according to note 1, wherein
the side surface of the second connection member overlaps the protrusion of the base member in the first direction.

Note 3: The device according to note 1 or 2, wherein
the space between the second electrode and the control pad includes a first space and a second space, the first space extending along the second surface of the base member in a second direction, the second space extending in a third direction, the third direction crossing the second direction in the second surface, and
the protrusion of the base member includes a first portion extending in the second direction and a second portion extending in the third direction.

Note 4: The device according to note 3, wherein
the first portion of the protrusion of the base member has a length in the second direction equal to or greater than a length in the second direction of the first space, and
the second portion of the protrusion in the base member has a length in the third direction equal to or greater than a length in the third direction of the second space.

Note 5: The device according to any one of notes 1 to 4, wherein the second connection member covers the second electrode other than an outer periphery of the second electrode of the semiconductor chip.

Note 6: The device according to any one of notes 1 to 4, wherein the side surface of the second connection member is positioned inward of an outer periphery of the second electrode.

Note 7. The device according to any one of notes 1 to 6, wherein the base member further includes a second protrusion at the second surface side, the protrusion and the second protrusion being arranged in at least one of the second direction or the third direction.

Note 8: The device according to note 7, wherein the protrusion and the second protrusion of the base member are arranged in the second direction, and the second protrusion extends in the third direction.

Note 9: The device according to any one of notes 1 to 8, wherein the semiconductor chip has a quadrilateral shape in a plan view parallel to the second surface of the base member,
the base member further includes a fourth protrusion provided at the second surface side,
the fourth protrusion protrudes in the first direction, and
the protrusion and the fourth protrusion of the base member are arranged along the second surface of the base member in a diagonal direction of the quadrilateral of the semiconductor chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and overview of the invention.

What is claimed is:

1. A semiconductor device, comprising:
a base member including a first surface, a second surface at a side opposite to the first surface, and a protrusion provided at the second surface side, the protrusion protruding in a first direction perpendicular to the second surface;
a semiconductor chip mounted on the second surface of the base member via a first connection member, the semiconductor chip including a first electrode, a second electrode, a control pad, and a semiconductor part, the semiconductor part having a front surface and a back surface, the first electrode being provided on the back surface, the second electrode and the control pad being provided on the front surface, the control pad being apart from the second electrode, the semiconductor part being positioned between the first electrode and the second electrode and between the first electrode and the control pad, the first connection member being connected to the first electrode; and
a first conductive member bonded on the second electrode of the semiconductor chip via a second connection member, the second connection member including a side surface extending along a space between the second electrode and the control pad of the semiconductor chip,
the protrusion of the base member overlapping the second connection member in the first direction, the protrusion of the base member extending along the side surface below the side surface of the second connection member.

2. The device according to claim 1, wherein
the side surface of the second connection member overlaps the protrusion of the base member in the first direction.

3. The device according to claim 1, wherein
the protrusion of the base member is provided without overlapping the control pad in the first direction.

4. The device according to claim 1, wherein
the protrusion of the base member is provided without overlapping the space between the second electrode and the control pad in the first direction.

5. The device according to claim 1, wherein
the space between the second electrode and the control pad includes a first space and a second space, the first space extending along the second surface of the base member in a second direction, the second space extending in a third direction, the third direction crossing the second direction in the second surface, and
the protrusion of the base member includes a first portion extending in the second direction and a second portion extending in the third direction.

6. The device according to claim 5, wherein
the first portion of the protrusion of the base member has a length in the second direction equal to or greater than a length in the second direction of the first space, and
the second portion of the protrusion in the base member has a length in the third direction equal to or greater than a length in the third direction of the second space.

7. The device according to claim 1, wherein
the second connection member covers the second electrode other than an outer periphery of the second electrode of the semiconductor chip.

8. The device according to claim 1, wherein
the side surface of the second connection member is positioned inward of an outer periphery of the second electrode.

9. The device according to claim 1, wherein
the base member further includes a second protrusion at the second surface side, the protrusion and the second protrusion being arranged in at least one of the second direction or the third direction.

10. The device according to claim 9, wherein
the protrusion and the second protrusion of the base member are arranged in the second direction, and the second protrusion extends in the third direction.

11. The device according to claim 10, wherein
the second protrusion of the base member has a length in the third direction and a width in the second direction, the length in the third direction being greater than the width in the second direction.

12. The device according to claim 10, wherein
the base member further includes a third protrusion positioned between the protrusion and the second protrusion, and
the third protrusion has a length in the third direction greater than a length in the third direction of the second protrusion and less than a length in the third direction of the protrusion.

13. The device according to claim 10, wherein
the second protrusion of the base member includes a first end proximate to an outer edge of the base member and a second end at a side opposite to the first end, and
a first distance in the second direction from the protrusion of the base member to the first end of the second protrusion is greater than a second distance in the second direction from the protrusion to the second end of the second protrusion.

14. The device according to claim 1, wherein
the semiconductor chip has a quadrilateral shape in a plan view parallel to the second surface of the base member,
the base member further includes a fourth protrusion provided at the second surface side,
the fourth protrusion protrudes in the first direction, and the protrusion and the fourth protrusion of the base member are arranged along the second surface of the base member in a diagonal direction of the quadrilateral of the semiconductor chip.

\* \* \* \* \*